United States Patent
Lower et al.

(10) Patent No.: US 9,196,555 B1
(45) Date of Patent: *Nov. 24, 2015

(54) INTEGRATED CIRCUIT PROTECTION AND RUGGEDIZATION COATINGS AND METHODS

(75) Inventors: Nathan P. Lower, North Liberty, IA (US); Ross K. Wilcoxon, Cedar Rapids, IA (US); Alan P. Boone, Swisher, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 31 days.

This patent is subject to a terminal disclaimer.

(21) Appl. No.: 13/287,734

(22) Filed: Nov. 2, 2011

Related U.S. Application Data

(62) Division of application No. 11/508,782, filed on Aug. 23, 2006, now Pat. No. 8,076,185.

(51) Int. Cl.
*H01L 23/28* (2006.01)
*H01L 23/24* (2006.01)
*H01L 23/48* (2006.01)

(52) U.S. Cl.
CPC .............. *H01L 23/24* (2013.01); *H01L 23/48* (2013.01)

(58) Field of Classification Search
None
See application file for complete search history.

(56) References Cited

U.S. PATENT DOCUMENTS

| | | |
|---|---|---|
| 3,170,813 A | 2/1965 | Duncan et al. |
| 3,508,974 A | 4/1970 | Bressler |
| 3,654,528 A | 4/1972 | Barkan |
| 3,723,790 A | 3/1973 | Dumbaugh et al. |
| 3,812,404 A | 5/1974 | Barkan et al. |
| 3,830,892 A * | 8/1974 | Wada ............................ 264/489 |
| 4,177,015 A | 12/1979 | Davidson |
| 4,294,658 A | 10/1981 | Humphreys et al. |
| 4,410,874 A | 10/1983 | Scapple et al. |
| 4,505,644 A | 3/1985 | Meisner et al. |
| 4,512,808 A * | 4/1985 | Pesch et al. ........................ 524/5 |
| 4,513,029 A | 4/1985 | Sakai |
| 4,560,084 A | 12/1985 | Wolfson |
| 4,572,924 A | 2/1986 | Wakely et al. |
| 4,622,433 A | 11/1986 | Frampton |
| 4,678,868 A | 7/1987 | Kraska et al. |
| 4,761,518 A | 8/1988 | Butt et al. |
| 4,765,948 A | 8/1988 | Deluca et al. |
| 4,773,826 A | 9/1988 | Mole |
| 4,802,531 A | 2/1989 | Nathenson et al. |

(Continued)

FOREIGN PATENT DOCUMENTS

| | | |
|---|---|---|
| JP | 55-120083 | 9/1980 |
| JP | 57-027942 | 2/1982 |

(Continued)

OTHER PUBLICATIONS

Notice of Allowance for U.S. Appl. No. 12/493,022, mail date Sep. 20, 2012, 5 pages.

(Continued)

*Primary Examiner* — Steven T Sawyer
(74) *Attorney, Agent, or Firm* — Donna P. Suchy; Daniel M. Barbieri

(57) ABSTRACT

An electronics package includes a substrate and at least one electronic component coupled to the substrate. The electronics package comprises an alkali silicate coating forming a hermetic seal around at least a portion of the at least one electronic component.

21 Claims, 8 Drawing Sheets

(56) References Cited

U.S. PATENT DOCUMENTS

| | | | |
|---|---|---|---|
| 4,882,212 A | 11/1989 | Singhdeo et al. | |
| 4,940,858 A | 7/1990 | Taylor et al. | |
| 4,963,503 A | 10/1990 | Aoki et al. | |
| 5,041,342 A | 8/1991 | Umeda et al. | |
| 5,136,365 A | 8/1992 | Pennisi et al. | |
| 5,140,109 A | 8/1992 | Matsumoto et al. | |
| 5,184,211 A | 2/1993 | Fox | |
| 5,195,231 A | 3/1993 | Fanning et al. | |
| 5,232,970 A | 8/1993 | Solc et al. | |
| 5,244,726 A | 9/1993 | Laney et al. | |
| 5,265,136 A | 11/1993 | Yamazaki et al. | |
| 5,288,769 A * | 2/1994 | Papageorge et al. | 523/200 |
| 5,315,155 A | 5/1994 | O'Donnelly et al. | |
| 5,405,808 A * | 4/1995 | Rostoker et al. | 29/841 |
| 5,502,889 A | 4/1996 | Casson et al. | |
| 5,581,286 A | 12/1996 | Hayes et al. | |
| 5,650,759 A | 7/1997 | Hittman et al. | |
| 5,686,703 A | 11/1997 | Yamaguchi | |
| 5,690,837 A | 11/1997 | Nakaso et al. | |
| 5,702,963 A | 12/1997 | Vu et al. | |
| 5,863,605 A | 1/1999 | Bak-Boychuk et al. | |
| 5,916,944 A | 6/1999 | Camilletti et al. | |
| 5,958,794 A | 9/1999 | Bruxvoort et al. | |
| 5,965,947 A | 10/1999 | Nam et al. | |
| 5,991,351 A | 11/1999 | Woolley | |
| 6,010,956 A | 1/2000 | Takiguchi et al. | |
| 6,019,165 A | 2/2000 | Batchelder | |
| 6,021,844 A | 2/2000 | Batchelder | |
| 6,027,791 A | 2/2000 | Higashi et al. | |
| 6,028,619 A | 2/2000 | Saita et al. | |
| 6,039,896 A | 3/2000 | Miyamoto et al. | |
| 6,048,656 A | 4/2000 | Akram et al. | |
| 6,087,018 A | 7/2000 | Uchiyama | |
| 6,110,656 A | 8/2000 | Eichorst et al. | |
| 6,121,175 A | 9/2000 | Drescher et al. | |
| 6,124,224 A | 9/2000 | Sridharan et al. | |
| 6,159,910 A | 12/2000 | Shimizu et al. | |
| 6,356,334 B1 | 3/2002 | Mathew et al. | |
| 6,370,015 B2 | 4/2002 | Noda et al. | |
| 6,423,415 B1 | 7/2002 | Greene et al. | |
| 6,451,283 B1 | 9/2002 | Kuznicki et al. | |
| 6,452,090 B2 | 9/2002 | Takato et al. | |
| 6,486,087 B1 | 11/2002 | Saling et al. | |
| 6,496,359 B2 | 12/2002 | Clark et al. | |
| 6,541,083 B1 * | 4/2003 | Landa et al. | 428/34 |
| 6,541,832 B2 | 4/2003 | Coyle | |
| 6,586,087 B2 | 7/2003 | Young | |
| 6,586,675 B1 | 7/2003 | Bealka et al. | |
| 6,599,643 B2 | 7/2003 | Heimann et al. | |
| 6,617,041 B2 | 9/2003 | Hahn et al. | |
| 6,624,276 B2 | 9/2003 | Lamers et al. | |
| 6,658,861 B1 | 12/2003 | Ghoshal et al. | |
| 6,663,793 B2 | 12/2003 | Parkhill et al. | |
| 6,664,567 B2 | 12/2003 | Kyoda et al. | |
| 6,665,186 B1 | 12/2003 | Calmidi et al. | |
| 6,708,501 B1 | 3/2004 | Ghoshal et al. | |
| 6,768,629 B1 | 7/2004 | Allen et al. | |
| 6,798,072 B2 | 9/2004 | Kajiwara et al. | |
| 6,800,326 B1 | 10/2004 | Uchiyama | |
| 6,800,330 B2 | 10/2004 | Hayashi et al. | |
| 6,844,023 B2 | 1/2005 | Schulman et al. | |
| 6,918,984 B2 | 7/2005 | Murray et al. | |
| 6,960,878 B2 | 11/2005 | Sakano et al. | |
| 6,986,859 B2 | 1/2006 | Mazany et al. | |
| 7,045,905 B2 | 5/2006 | Nakashima | |
| 7,078,263 B2 | 7/2006 | Dean | |
| 7,114,251 B2 | 10/2006 | Mashino | |
| 7,131,286 B2 | 11/2006 | Ghoshal et al. | |
| 7,175,937 B2 | 2/2007 | Cho et al. | |
| 7,176,564 B2 | 2/2007 | Kim | |
| 7,202,598 B2 | 4/2007 | Juestel et al. | |
| 7,265,977 B2 | 9/2007 | Martin et al. | |
| 7,293,416 B2 | 11/2007 | Ghoshal | |
| 7,296,417 B2 | 11/2007 | Ghoshal | |
| 7,297,206 B2 | 11/2007 | Naruse et al. | |
| 7,307,286 B2 | 12/2007 | Ito et al. | |
| 7,327,039 B2 | 2/2008 | Charles et al. | |
| 7,340,904 B2 | 3/2008 | Sauciuc et al. | |
| 7,342,787 B1 | 3/2008 | Bhatia | |
| 7,348,665 B2 | 3/2008 | Sauciuc et al. | |
| 7,365,984 B2 | 4/2008 | Jeong | |
| 7,391,060 B2 | 6/2008 | Oshio | |
| 7,441,087 B2 | 10/2008 | Hakura et al. | |
| 7,473,460 B2 | 1/2009 | Meguro et al. | |
| 7,491,431 B2 | 2/2009 | Chiruvolu et al. | |
| 7,497,961 B2 | 3/2009 | Keenan et al. | |
| 7,651,556 B2 | 1/2010 | Komiyama et al. | |
| 7,671,468 B2 | 3/2010 | Kanazawa et al. | |
| 7,692,259 B2 | 4/2010 | Suehiro | |
| 7,709,093 B2 | 5/2010 | Makowski et al. | |
| 7,737,356 B2 | 6/2010 | Goldstein | |
| 7,910,403 B2 | 3/2011 | Hirano et al. | |
| 7,915,527 B1 | 3/2011 | Lower et al. | |
| 7,985,392 B2 | 7/2011 | Hayashi et al. | |
| 8,017,872 B2 | 9/2011 | Cripe et al. | |
| 8,075,185 B2 | 12/2011 | Hecht et al. | |
| 8,076,185 B1 | 12/2011 | Lower et al. | |
| 8,084,855 B2 | 12/2011 | Lower et al. | |
| 8,119,040 B2 | 2/2012 | Lower et al. | |
| 8,174,830 B2 | 5/2012 | Lower et al. | |
| 8,581,108 B1 | 11/2013 | Boone et al. | |
| 8,617,913 B2 | 12/2013 | Lower et al. | |
| 2001/0015443 A1 | 8/2001 | Komoto | |
| 2001/0030493 A1 | 10/2001 | Noda et al. | |
| 2001/0033012 A1 * | 10/2001 | Kommerling et al. | 257/679 |
| 2002/0054976 A1 | 5/2002 | Nakamura et al. | |
| 2002/0076192 A1 | 6/2002 | Bartholomew et al. | |
| 2002/0189894 A1 | 12/2002 | Davis et al. | |
| 2003/0218258 A1 * | 11/2003 | Charles et al. | 257/783 |
| 2004/0194667 A1 | 10/2004 | Reuscher | |
| 2005/0099775 A1 | 5/2005 | Pokharna et al. | |
| 2005/0116237 A1 | 6/2005 | Voutsas | |
| 2005/0133863 A1 * | 6/2005 | Werner et al. | 257/341 |
| 2006/0017069 A1 * | 1/2006 | Bergmann et al. | 257/212 |
| 2006/0045755 A1 | 3/2006 | McDonald et al. | |
| 2006/0068218 A1 | 3/2006 | Hooghan et al. | |
| 2006/0113066 A1 | 6/2006 | Mongia et al. | |
| 2006/0135342 A1 | 6/2006 | Anderson et al. | |
| 2006/0210790 A1 | 9/2006 | Horio et al. | |
| 2006/0250731 A1 | 11/2006 | Parkhurst et al. | |
| 2006/0283546 A1 | 12/2006 | Tremel et al. | |
| 2007/0102833 A1 | 5/2007 | Hack et al. | |
| 2007/0108586 A1 | 5/2007 | Uematsu et al. | |
| 2008/0006204 A1 | 1/2008 | Rusinko et al. | |
| 2008/0063875 A1 | 3/2008 | Robinson et al. | |
| 2008/0299300 A1 | 12/2008 | Wilcoxon et al. | |
| 2009/0110904 A1 | 4/2009 | Mack et al. | |
| 2009/0183774 A1 | 7/2009 | Atanackovic | |
| 2009/0279257 A1 | 11/2009 | Lower et al. | |
| 2010/0064518 A1 | 3/2010 | Lower et al. | |
| 2010/0064695 A1 | 3/2010 | Wilcoxon et al. | |
| 2010/0065256 A1 | 3/2010 | Wilcoxon et al. | |
| 2010/0066178 A1 | 3/2010 | Lower et al. | |
| 2012/0118623 A1 | 5/2012 | Lower et al. | |

FOREIGN PATENT DOCUMENTS

| | | |
|---|---|---|
| JP | 60-013875 | 1/1985 |
| JP | 02-064071 | 3/1990 |
| JP | 11-095246 | 4/1994 |
| JP | 2003-332505 A | 11/2003 |
| JP | 2006-045420 | 2/2006 |
| WO | WO2006/095677 A1 | 9/2006 |

OTHER PUBLICATIONS

Notice of Allowance for U.S. Appl. No. 11/732,982, mail date Nov. 8, 2012, 8 pages.

Office Action for U.S. Appl. No. 13/359,105, mail date May 8, 2012, 12 pages.

Office Action for U.S. Appl. No. 12/240,775, mail date Sep. 6, 2012, 9 pages.

Office Action for U.S. Appl. No. 11/959,225, mail date Sep. 25, 2012, 16 pages.

(56) References Cited

OTHER PUBLICATIONS

Office Action for U.S. Appl. No. 13/359,105, mail date Oct. 19, 2012, 7 pages.
Advisory Action for U.S. Appl. No. 11/959,225, mail date Jul. 31, 2012, 3 pages.
Advisory Action for U.S. Appl. No. 12/240,775, mail date Nov. 14, 2012, 2 pages.
Amendment and Reply for U.S. Appl. No. 11/732,982, mail date Oct. 25, 2010, 6 pages.
Amendment and Reply for U.S. Appl. No. 11/732,982, mail date Sep. 28, 2012, 7 pages.
Amendment and Reply for U.S. Appl. No. 11/959,225, mail date Jul. 5, 2011, 6 pages.
Amendment and Reply for U.S. Appl. No. 11/959,225, mail date Jun. 25, 2012, 14 pages.
Amendment and Reply for U.S. Appl. No. 12/240,775, mail date Jul. 2, 2012, 12 pages.
Amendment and Reply for U.S. Appl. No. 12/240,775, mail date Nov. 6, 2012, 8 pages.
Amendment and Reply for U.S. Appl. No. 12/493,022, mail date Aug. 28, 2012, 7 pages.
Amendment and Reply for U.S. Appl. No. 12/493,022, mail date Mar. 23, 2012, 3 pages.
Notice of Allowance for U.S. Appl. No. 11/732,982, mail date Dec. 19, 2012, 2 pages.
Office Action for U.S. Appl. No. 13/359,105, mail date Jan. 17, 2013, 7 pages.
Request for Continued Examination for U.S. Appl. No. 11/959,225, mail date Aug. 27, 2012, 19 pages.
Restriction Requirement for U.S. Appl. No. 11/732,982, mail date Sep. 24, 2010, 5 pages.
Restriction Requirement for U.S. Appl. No. 12/493,022, mail date Feb. 22, 2012, 6 pages.
Restriction Requirement for U.S. Appl. No. 13/329,068, mail date Jan. 15, 2013, 5 pages.
U.S. Appl. No. 11/732,982, filed Apr. 5, 2007, Boone et al.
U.S. Appl. No. 11/959,225, filed Dec. 18, 2007, Lower et al.
Click et al., Schott Low Temperature Bonding for Precision Optics, http://optics.nasa.gov/tech_days/tech_days_2004/docs/18%20Aug%202004/23%20Schott%20Low%20Temperature%20Bonding.pdf, 20 pages.
Golubev et al., Modeling of Acid Base Properties of Binary Alkali-Silicate Melts, 2004, http://www.ipme.ru/e-journals/RAMS/no_1604/golubev/golubev.pdf, 8 pages.
Kennedy, Strength and Fracture Toughness of Binary Alkali Silicate Glasses (Abstract only), http://www.oai.dtic.mil/oai/oai?verb=getRecord&metadataPrefix=html&identifier=ADA016820, Feb. 14, 1974, 1 page.
Lewis et al., Direct Writing in Three Dimension, Materials Today, Jul./Aug. 2004, 8 pages.
Mysen et al., Properties and Structure (Developments in Geochemistry), Silicate Glasses and Melts, http://www.amazon.com/Silicate-Glasses-Melts-Developments-Geochemistry/dp/0444520112, 4 pages.
Nascimento et al., Universal Curve of Ionic Conductivities in Binary Alkali Silicate Glasses, http://www.springerlink.com/content/p7535075x1872016/, Journal of Materials Science, 2005, 3 pages.
Optomec® Systems M3D® Breakthrough Technology for Printable Electronics, 2 pages.
Pedone et al., Insight into Elastic Properties of Binary Alkali Silicate Glasses; Prediction and Interpretation through Atomistic Simulation Techniques, http://pubs.acs.org/doi/abs/10.1021/cm062619r, Chemistry of Materials, 2007, 2 pages.
PQ Corporation, Bonding and Coating Applications of PQ® Soluble Silicates, Bulletin Dec. 31, 2003, 1 page.
PQ Corporation, PQ® Soluble Silicates in Refractory and Chemical-Resistant Cements, Bulletin Jan. 24, 2003, 1 page.
Shermer, Thermal Expansion of Binary Alkali Silicate Glasses, http://nvl.nist.gov/pub/nistpubs/jres/057/2/V57.N02.A05, Journal of Research of the National Bureau of Standards, Aug. 1956, 5 pages.
Technical Standard Order, TSO-C115b, Airborne Area Navigation Equipment Using Multi-Sensor Inputs, Sep. 30, 1994, 11 pages.
Techpowerup, NanoCoolers Puts Liquid Metal in Your PC, http://www.techpowerup.com/?3105, May 4, 2005, 19 pages.
The Mixed-Alkali Effect for the Viscosity of Glasses, http://glassproperties.com/viscosity/mixed-alkali-effect-viscosity/, 7 pages.
The Structure of Glasses, Alkali Silicate Glasses, http://www.ptc.tugraz.at/specmag/struct/ss.htm, 1 page.
Thresh, The Action of Natural Waters on Lead, The Analyst, Proceedings of the Society of Public Analysts and Other Analytical Chemists, Nov. 1922, 10 pages.
Amendment and Reply for U.S. Appl. No. 11/508,782, mail date Sep. 2, 2008, 7 pages.
Office Action for U.S. Appl. No. 11/508,782, mail date Dec. 24, 2008, 9 pages.
Amendment and Reply for U.S. Appl. No. 11/508,782, mail date Mar. 24, 2009, 10 pages.
Office Action for U.S. Appl. No. 11/508,782, mail date Jun. 16, 2009, 13 pages.
Amendment and Reply for U.S. Appl. No. 11/508,782, mail date Aug. 14, 2009, 12 pages.
Advisory Action for U.S. Appl. No. 11/508,782, mail date Aug. 31, 2009, 3 pages.
Response for U.S. Appl. No. 11/508,782, mail date Nov. 13, 2009, 14 pages.
Office Action for U.S. Appl. No. 11/508,782, mail date Feb. 24, 2010, 12 pages.
Amendment and Reply for U.S. Appl. No. 11/508,782, mail date Jun. 24, 2010, 10 pages.
Office Action for U.S. Appl. No. 11/508,782, mail date Sep. 2, 2010, 13 pages.
Amendment and Reply for U.S. Appl. No. 11/508,782, mail date Nov. 2, 2010, 12 pages.
Supplemental Amendment and Reply for U.S. Appl. No. 11/508,782, mail date Nov. 3, 2010, 4 pages.
Advisory Action and Examiner Interview Summary for U.S. Appl. No. 11/508,782, mail date Nov. 23, 2010, 5 pages.
Request for Continued Examination for U.S. Appl. No. 11,508,782, mail date Dec. 2, 2010, 10 pages.
Examiner Interview Summary for U.S. Appl. No. 11/508,782, mail date Jan. 5, 2011, 2 pages.
Office Action for U.S. Appl. No. 11/508,782, mail date Jan. 19, 2011, 9 pages.
Amendment and Reply for U.S. Appl. No. 11/508,782, mail date Apr. 5, 2011, 9 pages.
Notice of Allowance for U.S. Appl. No. 11/508,782, mail date May 31, 2011, 9 pages.
Notice of Allowance for U.S. Appl. No. 11/508,782, mail date Jul. 26, 2011, 4 pages.
Request for Continued Examination for U.S. Appl. No. 11/508,782, mail date Aug. 30, 2011, 6 pages.
Notice of Allowance for U.S. Appl. No. 11/508,782, mail date Sep. 20, 2011, 7 pages.
Restriction Requirement for U.S. Appl. No. 11/959,225, mail date Jul. 22, 2009, 10 pages.
Response to Restriction Requirement for U.S. Appl. No. 11/959,225, mail date Aug. 24, 2009, 2 pages.
Office Action for U.S. Appl. No. 11/959,225, mail date Dec. 2, 2009, 14 pages.
Response for U.S. Appl. No. 11/959,225, mail date Mar. 2, 2010, 9 pages.
Office Action for U.S. Appl. No. 11/959,225, mail date May 26, 2010, 16 pages.
Amendment and Reply for U.S. Appl. No. 11/959,225, mail date Aug. 26, 2010, 11 pages.
Office Action for U.S. Appl. No. 11/959,225, mail date Oct. 27, 2010, 11 pages.
Amendment and Reply for U.S. Appl. No. 11/959,225, mail date Jan. 27, 2011, 9 pages.
Office Action for U.S. Appl. No. 11/959,225, mail date Apr. 13, 2011, 16 pages.

(56) References Cited

OTHER PUBLICATIONS

Amendment and Reply for U.S. Appl. No. 11/959,225, mail date Jun. 13, 2011, 12 pages.
Advisory Action for U.S. Appl. No. 11/959,225, mail date Jul. 5, 2011, 3 pages.
Office Action for U.S. Appl. No. 11/959,225, mail date Nov. 18, 2011, 16 pages.
Amendment and Reply for U.S. Appl. No. 11/959,225, mail date Feb. 15, 2012, 15 pages.
Office Action for U.S. Appl. No. 11/959,225, mail date Apr. 25, 2012, 17 pages.
Office Action for U.S. Appl. No. 11/732,982, mail date Feb. 2, 2011, 15 pages.
Amendment and Reply for U.S. Appl. No. 11/732,982, mail date May 2, 2011, 12 pages.
Office Action for U.S. Appl. No. 11/732,982, mail date Jun. 21, 2011, 14 pages.
Request for Continued Examination for U.S. Appl. No. 11/732,982, mail date Aug. 22, 2011, 11 pages.
Office Action for U.S. Appl. No. 11/732,982, mail date Sep. 14, 2011, 13 pages.
Amendment and Reply for U.S. Appl. No. 11/732,982, mail date Jan. 13, 2012, 11 pages.
Office Action for U.S. Appl. No. 11/732,982, mail date Apr. 16, 2012, 15 pages.
Reply for U.S. Appl. No. 11/732,982, mail date Jun. 13, 2012, 11 pages.
Office Action for U.S. Appl. No. 11/732,982, mail date Jul. 3, 2012, 15 pages.
Office Action for U.S. Appl. No. 11/784,158, mail date Apr. 21, 2009, 10 pages.
Amendment and Reply for U.S. Appl. No. 11/784,158, mail date Jul. 21, 2009, 10 pages.
Office Action for U.S. Appl. No. 11/784,158, mail date Oct. 8, 2009, 7 pages.
Response for U.S. Appl. No. 11/784,158, mail date Jan. 8, 2010, 10 pages.
Office Action for U.S. Appl. No. 11/784,158, mail date Mar. 26, 2010, 7 pages.
Amendment and Reply for U.S. Appl. No. 11/784,158, mail date May 26, 2010, 12 pages.
Terminal Disclaimer for U.S. Appl. No. 11/784,158, mail date May 26, 2010, 1 page.
Terminal Disclaimer Decision for U.S. Appl. No. 11/784,158, mail date Jun. 8, 2010, 1 page.
Office Action for U.S. Appl. No. 11/784,158, mail date Jun. 17, 2010, 6 pages.
Notice of Allowance for U.S. Appl. No. 11/784,158, mail date Nov. 29, 2010, 4 pages.
Office Action for U.S. Appl. No. 12/116,126, mail date Nov. 20, 2009, 7 pages.
Response for U.S. Appl. No. 12/116,126, mail date Feb. 22, 2010, 10 pages.
Office Action for U.S. Appl. No. 12/116,126, mail date Apr. 22, 2010, 7 pages.
Amendment and Reply for U.S. Appl. No. 12/116,126, mail date Jun. 22, 2010, 7 pages.
Advisory Action for U.S. Appl. No. 12/116,126, mail date Jun. 29, 2010, 4 pages.
Request for Continued Examination for U.S. Appl. No. 12/116,126, mail date Jul. 22, 2010, 4 pages.
Amendment and Reply for U.S. Appl. No. 12/116,126, mail date Jul. 22, 2010, 9 pages.
Office Action for U.S. Appl. No. 12/116,126, mail date Oct. 25, 2010, 8 pages.
Amendment and Reply for U.S. Appl. No. 12/116,126, mail date Jan. 25, 2011, 8 pages.
Office Action for U.S. Appl. No. 12/116,126, mail date Feb. 25, 2011, 9 pages.
Request for Continued Examination for U.S. Appl. No. 12/116,126, mail date Apr. 29, 2011, 4 pages.
Amendment and Reply for U.S. Appl. No. 12/116,126, mail date Apr. 29, 2011, 9 pages.
Office Action for U.S. Appl. No. 12/116,126, mail date May 10, 2011, 8 pages.
Amendment and Reply for U.S. Appl. No. 12/116,126, mail date Aug. 10, 2011, 11 pages.
Office Action for U.S. Appl. No. 12/116,126, mail date Sep. 12, 2011, 11 pages.
Amendment and Reply for U.S. Appl. No. 12/116,126, mail date Dec. 12, 2011, 10 pages.
Notice of Allowance for U.S. Appl. No. 12/116,126, mail date Jan. 5, 2012, 10 pages.
Office Action for U.S. Appl. No. 12/240,775, mail date May 26, 2011, 9 pages.
Amendment and Reply for U.S. Appl. No. 12/240,775, mail date Sep. 26, 2011, 11 pages.
Restriction Requirement for U.S. Appl. No. 12/240,775, mail date Jan. 12, 2012, 5 pages.
Office Action for U.S. Appl. No. 12/240,775, mail date Apr. 2, 2012, 8 pages.
Office Action for U.S. Appl. No. 11/732,981, mail date Oct. 6, 2010, 9 pages.
Amendment and Reply for U.S. Appl. No. 11/732,981, mail date Jan. 6, 2011, 9 pages.
Office Action for U.S. Appl. No. 11/732,981, mail date Mar. 16, 2011, 7 pages.
Request for Continued Examination for U.S. Appl. No. 11/732,981, mail date May 16, 2011, 12 pages.
Terminal Disclaimer for U.S. Appl. No. 11/732,981, mail date May 16, 2011, 1 page.
Terminal Disclaimer Decision for U.S. Appl. No. 11/732,981, mail date Jul. 11, 2011, 1 page.
Notice of Allowance for U.S. Appl. No. 11/732,981, mail date Jul. 26, 2011, 7 pages.
Request for Continued Examination for U.S. Appl. No. 11/732,981, mail date Oct. 25, 2011, 4 pages.
Notice of Allowance for U.S. Appl. No. 11/732,981, mail date Dec. 29, 2011, 7 pages.
Office Action for U.S. Appl. No. 11/784,932, mail date Apr. 3, 2009, 8 pages.
Response for U.S. Appl. No. 11/784,932, mail date Jul. 2, 2009, 8 pages.
Office Action for U.S. Appl. No. 11/784,932, mail date Feb. 16, 2010, 10 pages.
Amendment and Reply for U.S. Appl. No. 11/784,932, mail date Jun. 14, 2010, 9 pages.
Request for Continued Examination for U.S. Appl. No. 11/784,932, mail date Jun. 14, 2010, 4 pages.
Office Action for U.S. Appl. No. 11/784,932, mail date Nov. 10, 2010, 9 pages.
Notice of Allowance for U.S. Appl. No. 11/784,932, mail date May 12, 2011, 6 pages.
Request for Continued Examination for U.S. Appl. No. 11/784,932, mail date Aug. 10, 2011, 6 pages.
Notice of Allowance for U.S. Appl. No. 11/784,932, mail date Aug. 23, 2011, 8 pages.
Office Action for U.S. Appl. No. 12/284,670, mail date Sep. 28, 2010, 10 pages.
Amendment and Reply for U.S. Appl. No. 12/284,670, mail date Apr. 18, 2011, 9 pages.
Office Action for U.S. Appl. No. 12/284,670, mail date Feb. 17, 2011, 12 pages.
Notice of Allowance for U.S. Appl. No. 12/284,670, mail date May 11, 2011, 7 pages.
Office Action for U.S. Appl. No. 12/286,207, mail date Dec. 27, 2010, 14 pages.
Amendment and Reply for U.S. Appl. No. 12/286,207, mail date Mar. 28, 2011, 12 pages.
Notice of Allowance for U.S. Appl. No. 12/286,207, mail date Jun. 27, 2011, 12 pages.

(56) References Cited

OTHER PUBLICATIONS

Request for Continued Examination for U.S. Appl. No. 12/286,207, mail date Sep. 26, 2011, 4 pages.
Notice of Allowance for U.S. Appl. No. 12/286,207, mail date Oct. 6, 2011, 8 pages.
Office Action for U.S. Appl. No. 12/493,022, mail date May 30, 2012, 13 pages.
Amendment and Reply for U.S. Appl. No. 13/359,105, mail date Aug. 8, 2012, 10 pages.
International Search Report and Written Opinion for Application No. PCT/US2009/031699, mail date Aug. 18, 2009, 16 pages.
International Search Report and Written Opinion for Application No. PCT/US2009/036355, mail date Jun. 30, 2009, 11 pages.
International Search Report and Written Opinion for Application No. PCT/US2008/074224, mail date Jan. 30, 2009, 9 pages.
International Search Report and Written Opinion for Application No. PCT/US2008/075591, mail date Apr. 8, 2009, 7 pages.
Amendment and Reply for U.S. Appl. No. 11/959,225, mail date Jul. 22, 2013, 7 pages.
Notice of Allowance for U.S. Appl. No. 11/732,982, mail date Jul. 10, 2013, 6 pages.
Notice of Allowance for U.S. Appl. No. 13/359,105, mail date Jun. 24, 2013, 9 pages.
Office Action for U.S. Appl. No. 13/329,068, mail date Jun. 7, 2013, 6 pages.
Office Action for U.S. Appl. No. 11/959,225, mail date Apr. 23, 2013, 6 pages.
Office Action for U.S. Appl. No. 13/071,316, mail date Nov. 27, 2013, 8 pages.
Notice of Allowance on U.S. Appl. No. 14/055,746 Dated Oct. 21, 2014, 8 pages.
Non-Final Office Action on U.S. Appl. No. 13/071,316 Dated Jan. 29, 2015, 5 pages.
Non-Final Office Action on U.S. Appl. No. 14/140,192 Dated Jul. 20, 2015, 31 pages.
Notice of Allowance on U.S. Appl. No. 13/071,316 Dated Jul. 20, 2015, 7 pages.

* cited by examiner

REACTION OF SILICA ONTO METAL, GLASS, OR CERAMIC SURFACE.

INTEGRATED CIRCUIT PROTECTION AND RUGGEDIZATION COATINGS AND METHODS

CROSS-REFERENCE TO RELATED APPLICATION

This application is a divisional of U.S. application Ser. No. 11/508,782 filed Aug. 23, 2006, which is herein incorporated by reference in its entirety.

BACKGROUND

The invention generally relates to coatings for integrated circuits or other electronics packages. The invention also relates generally to methods of providing such coatings.

Conventionally integrated circuits are designed for use in relatively benign environments such as desktop PC's, cell phones, and the like. When these integrated circuit technologies are used in more demanding environments such as avionics they may experience excessively high failure rates due to the higher operating temperature, corrosion, etc. In addition, due to the sensitive nature of the information that may be stored on these components, it may be necessary to protect these devices from reverse engineering in the event that a system containing them were to fall into unfriendly hands. Modifying integrated circuits to improve their thermal performance, corrosion resistance, and tamper resistance is typically very expensive and can be detrimental to reliability.

Therefore, what is needed is a low-cost, simple method for making commercial integrated circuits more suitable for use in harsh environments. Further, what is needed is a low-cost coating for an integrated circuit which provides resistance to damage in harsh environments.

The techniques herein below extend to those embodiments which fall within the scope of the appended claims, regardless of whether they accomplish one or more of the above-mentioned needs.

SUMMARY

What is provided is an electronics package. The electronics package comprises a substrate and at least one electronic component coupled to the substrate. The electronics package also comprises an alkali silicate coating forming a hermetic seal around at least a portion of the at least one electronic component.

What is also provided is a method of forming an electronics package. The method comprises providing at least one electronic component. The method further comprises mixing an alkali silicate material with water, micro, and or nano particles and depositing the coating onto the electronic component. Further still, the method comprises curing the alkali silicate material.

What is also provided is an electronics package. The electronics package comprises a substrate and at least one electronic component coupled to the substrate. The electronics package also comprises a low curing temperature glass coating forming a hermetic seal around at least a portion of the at least one electronic component.

Further, what is provided is a method of forming an electronics package. The method comprises providing at least one electronic component and mixing a low curing temperature glass solution with water, micro and or nano particles. The method further comprises depositing the coating onto the electronic component and curing the glass material.

Alternative exemplary embodiments relate to other features and combination of features as may be generally recited in the claims.

BRIEF DESCRIPTION OF THE DRAWINGS

A better understanding of the features and advantages of the present invention will be obtained by reference to the following detailed description that sets forth illustrative embodiments by way of example only, in which the principles of the invention are utilized, and the accompanying drawings, of which.

DETAILED DESCRIPTION

Figure 1:
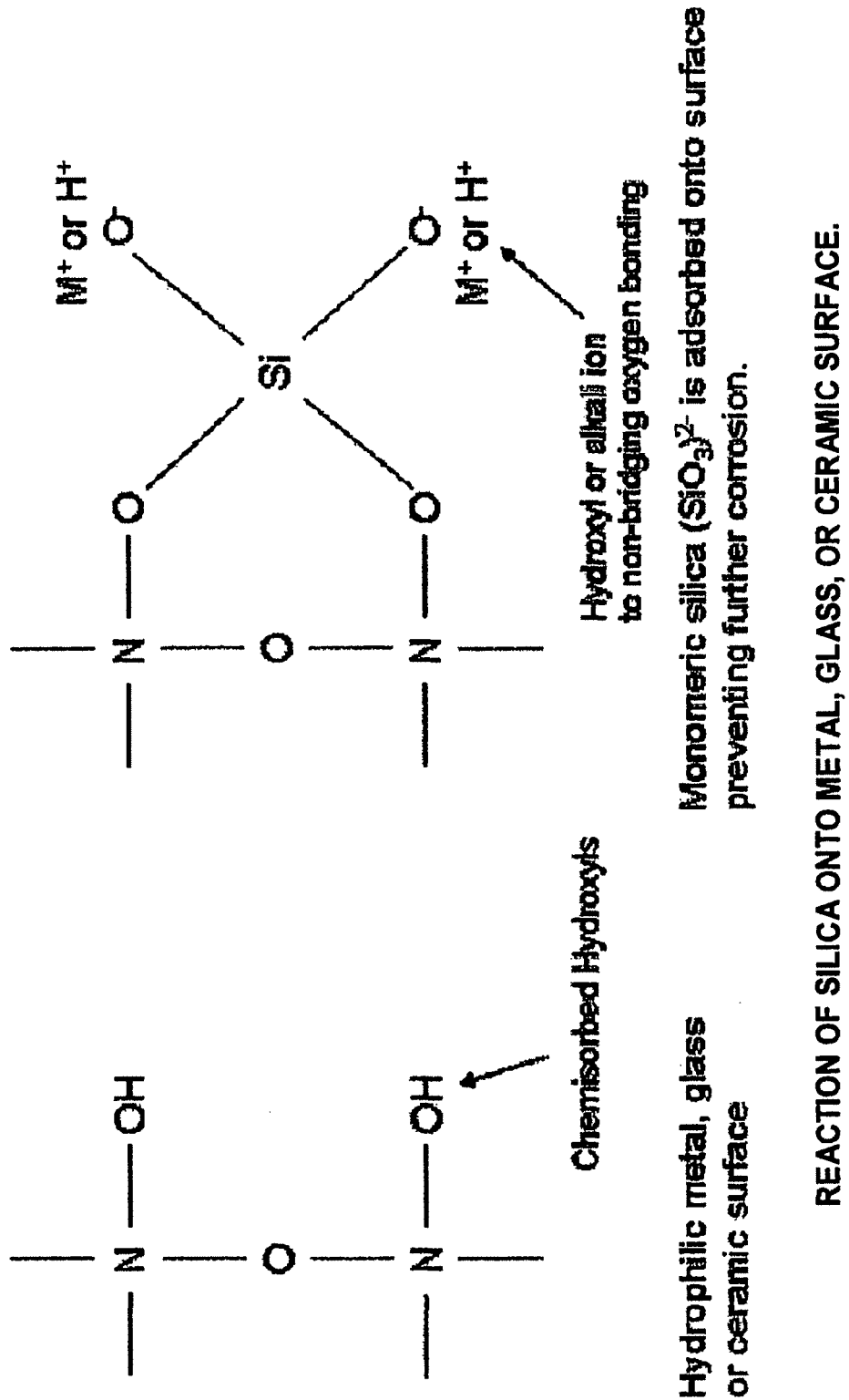
FIG. 1 is an exemplary embodiment of the reaction of silica onto metal, glass, or ceramic surfaces.

Before describing in detail the particular improved system and method, it should be observed that the invention includes, but is not limited to a novel structural combination of conventional data/signal processing components and communications circuits, and not in the particular detailed configurations thereof. Accordingly, the structure, methods, functions, control and arrangement of conventional components and circuits have, for the most part, been illustrated in the drawings by readily understandable block representations and schematic diagrams, in order not to obscure the disclosure with structural details which will be readily apparent to those skilled in the art, having the benefit of the description herein. Further, the invention is not limited to the particular embodiments depicted in the exemplary diagrams, but should be construed in accordance with the language in the claims.

In accordance with an exemplary embodiment, low processing temperature hermetic glass coatings for microelectronics packaging are desirable for hermetically sealing the packaging as well as providing resistance to corrosion and high temperature. These glass coatings are applied and cured at low temperatures, typically ≤100° C. and produce tightly adhering hermetic (water impermeable) coatings capable of withstanding very high temperatures, theoretically up to ~700° C. These glass coatings may be composed of alkali silicate glass with nanoparticle modifiers, including, but not limited to, nano calcium carbonate, nano zinc oxide and nano silicon dioxide. Aqueous alkali silicate composite solutions applied on or between surfaces of materials, dry to form a tough, tightly adhering inorganic bond that exhibits many desirable characteristics. Additionally, these solutions can be mixed with high thermal conductivity particles, such as, but not limited to, diamond, aluminum nitride, beryllium oxide, or metals to produce high thermal conductivity coatings for heat spreading.

Alkali silicate glasses are produced by fusing varying portions of sand ($SiO_2$) and alkali carbonate, ($M_2CO_3$) at high temperatures, between 1000-1500° C. The resulting product, upon cooling from its molten state, is an amorphous glass that can, under the appropriate processing conditions (temperature and pressure), be dissolved into water to produce liquid alkali silicate solutions. In accordance with an exemplary embodiment the glass is mixed with deionized water. The proportion of $SiO_2$ to $M_2O$ is typically defined as the weight ratio. The solution viscosity can be controlled by the concentration of water.

Alkali silicates, in general, are economical, environmentally friendly chemicals which have been used to protect a variety of materials from the corrosive effects of water. These chemicals are classified as corrosion inhibitors because they can deposit protective silicate rich films, isolating materials from corrosive attack. Additionally, they raise the pH of water which can make it less corrosive to metals. Studies have shown that alkali silicates are reactive with cationic metals and metal surfaces. This is the basis by which silicates inhibit corrosion, as illustrated in FIG. 1. Although alkali silicates have been used to protect materials from corrosion, alkali silicates have not been applied to protecting microelectronics, because in standard, off the shelf configuration, they may not cure appropriately and may not exhibit resultant properties which are desirable for protecting microelectronics in harsh environments.

Liquid alkali silicate solutions are commercially available in a variety of $SiO_2/M_2O$ ratios. Typically, ratios of 3.25 down to 1 can be obtained in aqueous or powder form. Highly siliceous liquid alkali silicate solutions tend to air dry rapidly, are the most refractory (high melting temperature), and are the most resistant to acids and corrosion. These silica rich liquid solutions tend to contain more water than the alkaline rich solutions (per similar viscosity), and thus undergo greater shrinkage while curing. Low ratio, alkaline rich, solutions tend to have greater elasticity, lower brittleness, and less shrinkage but may exhibit poor corrosion resistance. These low ratio coatings also dry more slowly because their alkali content creates a greater affinity for water. Many chemically resistant cements and mortars are produced using high ratio (N~3.25) alkali silicate solutions. In order for the silicate coatings to become impermeable and relatively insoluble, water must be completely removed. Air drying alone is usually not adequate for coatings which will be exposed to weather or high moisture environments. For these applications heat curing is often needed. Curing temperatures between 95 and 100° C. are often sufficient for adequate dehydration.

It is desirable to use highly corrosion resistant coatings in microelectronics packaging. While off-the-shelf alkali silicate solutions applied and processed in an appropriate manner could potentially provide a temporary hermetic barrier for microelectronic devices, they may not hold up in harsh testing environments, such as those produced during Highly Accelerated Stress Testing (HAST). In order to produce highly corrosion resistant coatings, modifiers must be added to the base alkali silicate solutions. Studies have shown that adding colloidal silicon dioxide to liquid alkali silicates can produce coatings that are comparable to that of current chromium based passivation, as characterized by salt spray testing. The purpose of these coatings is to protect steel and other metals from environmental corrosion. While a broad range of alkali silicate compositions may be used, highly silica rich coatings ($R \geq 3.25$) are the most corrosion resistant. These high ratio solutions can be made by adding additional $SiO_2$ to the base alkali silicate. However, these silica rich coatings often crack during the curing process. This cracking may be avoided by applying the appropriate solution mixture, thickness, and using an appropriate curing process, all of which may be application specific. Successful silicate rich coatings ($R \geq 4$) have been applied to the surfaces of silicon die and other inorganic substrates, which can be cured quickly, are crack free, and possess excellent adhesion strength and durability. These silica enhanced alkali silicate solutions provide improved corrosion resistance, but they can be made more corrosion resistant with the addition of calcium carbonate and or zinc oxide. Silicate solutions can react with calcium to form insoluble calcium-silicate compounds. Similarly, zinc oxide has been used to produce silicate coatings that are actually capable of shedding water. In order to achieve good mixing and dispersion, nano-sized particles of these constituents may be used in the coatings described herein. The large surface area per weight of the nanoparticles helps to maximize silicate glass modification for improved corrosion resistance of the composite.

It has been shown that increasing the silicate ratio, for alkali silicate glass coatings, may lead to cracking in thick coatings.

In an exemplary lab test, a particular amount of cracking was observed in thick silica rich (R=3.22) coatings, whereas no or little cracking was seen in the alkali rich coatings. In the silica rich coating, delamination was observed around the periphery and significant cracking throughout. When this same solution is applied in the appropriate thickness, a much stronger, crack free, fast curable coating can be formed. Such coatings have been applied to copper clad PCB substrates, aluminum and copper metals, and silicon die. These coatings are thin (<2 microns), but can be applied in multiple layers to build up the thickness. It has been observed that even these very thin coatings can provide a rugged moisture barrier at high temperatures ($\geq 450°$ C.). The corrosion protection of silicate coating applied to a copper clad PCB board has been demonstrated.

When compared with conventional silicon Room Temperature Vulcanizing (RTV) (polymer) coatings, very little oxidation protection is seen while the alkali silicate glass coating provided a hermetic seal.

In another exemplary embodiment, silica rich coatings may be applied to wire bonded dies. The purpose of the coatings is to prevent galvanic corrosion at the wire bond/pad interface, a primary failure mechanism in these devices. Preventing this galvanic corrosion leads to significantly greater reliability and can potentially eliminate the need for hermetic packaging.

In an exemplary and non-limiting embodiment, the alkali silicate glass coated wire bond pads may be formed by applying alkali silicate solutions onto chip surfaces then quickly curing at 150° C. for 5 minutes. Multiple layers may be applied to each of the coated wire bonds. The result of the coating process has been exemplary shown that the shear strength of coated joints were up to a 25% stronger than uncoated joints. Additionally, pull testing has shown no ball lifts (i.e. there were no separations between ball and pad) in the testing environment.

In addition to thin coatings, composites may be made by mixing the silicate solutions with high thermal conductivity particles such as aluminum nitride, beryllium oxide, diamond, and or metals. These coatings have been found to significantly improve heat transfer when coated over power dissipating devices. For example, thermal improvements in these coated devices are shown in FIG. 2.

Figure 2:
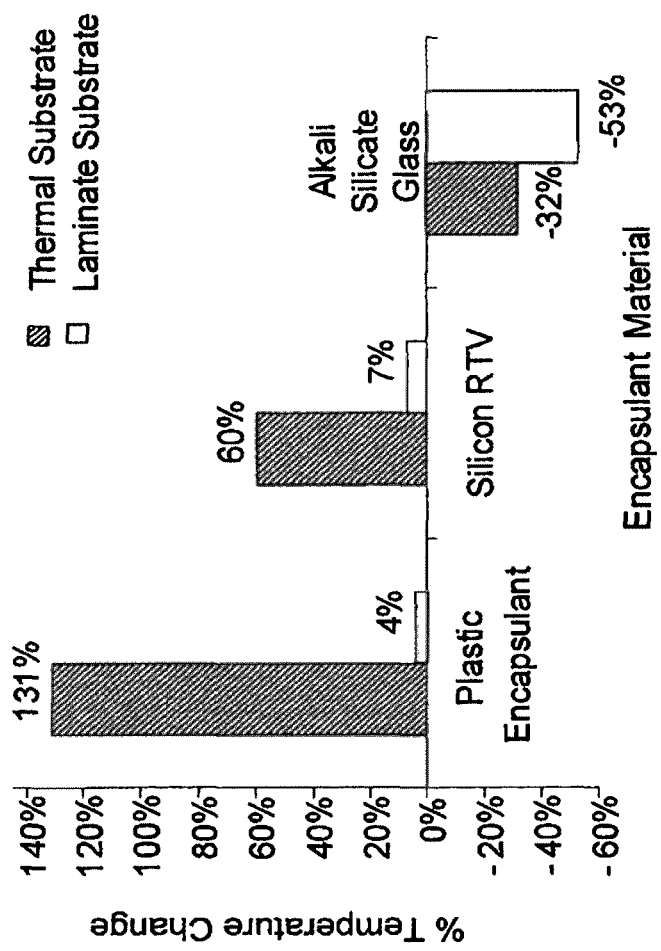
FIG. 2 is an exemplary graph of resultant performance of the thermal properties of alkali silicate glass composites.

Referring to FIG. 2, alkali silicate glass composites have been applied over power dissipating devices mounted on both laminate and copper metal substrates. The resulting package temperatures were reduced by more than 50%, while standard encapsulants caused device temperatures to increase up to 130%.

In a further exemplary embodiment, the addition of nanoparticles to the alkali silicate glass thermal composites provides additional corrosion resistance.

In an alternative exemplary embodiment, a low temperature bonding (LTB) solution, a proprietary composition, available from SCHOTT North America, Inc. may also be used.

Figure 3:
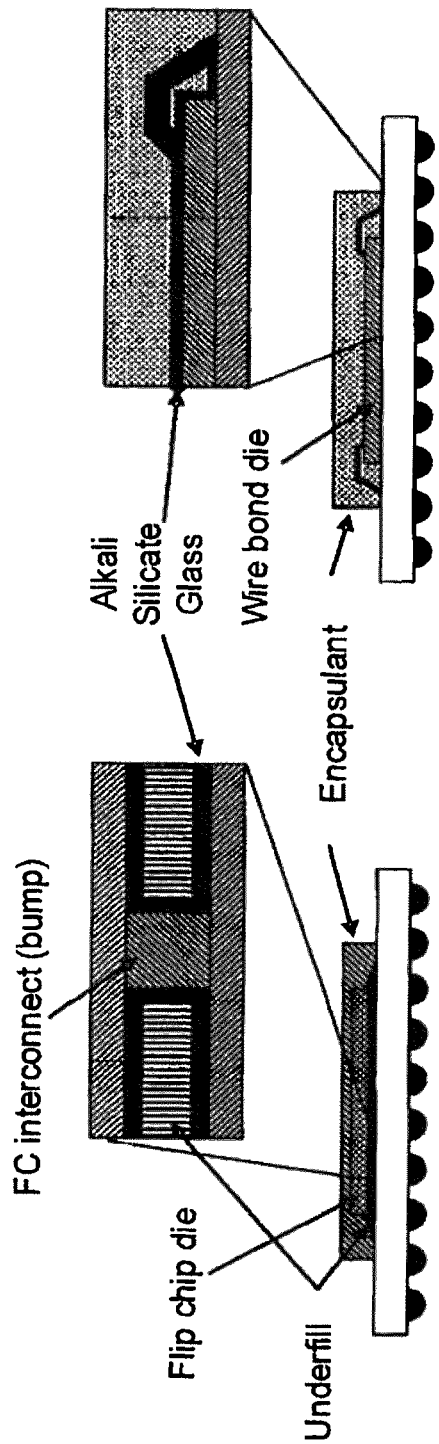
FIGS. 3-8 depict exemplary embodiments of various coating configurations for microelectronic packages.

In accordance with exemplary embodiments, numerous ways may be applied in which to provide heat and corrosion resistance to microelectronics packages. These are detailed below and include but are not limited to the following:

Coating bare dies that have been wire bonded or flip chip attached with a coating to form a hermetic glass barrier over the electronics. The coated device could then presumably be encapsulated using standard processing methods. The coating would be a thin layer of glass (≥100 nm) that will provide a hermetic seal to the die and therefore protect it from corrosive elements. For example, FIG. 3 depicts a coating applied to a flip chip and to a wire bonded dies for corrosion and tamper resistance.

Figure 4:
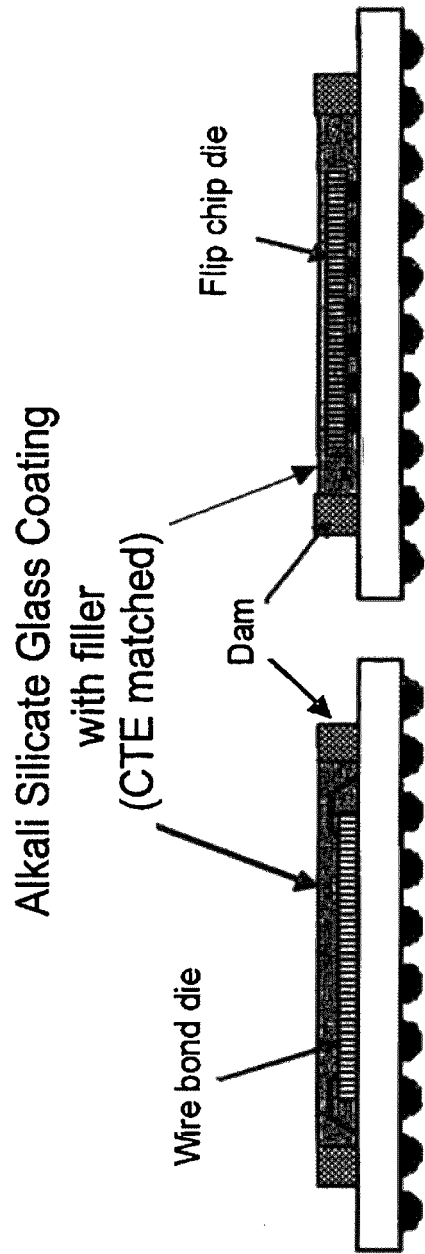

Adding particles to the coating to make it opaque and then coating the solution onto a wire bonded or flip chip die. Thus, the coating would provide tamper resistance to the device without exposing it to high processing temperatures. An illustration of this is shown in FIG. 4 which depicts the coating with opaque filler for the tamper resistance of wire bonded and flip chip dies. Alternatively, the solution could also be applied under a flip chip.

Adding high thermal conductivity particles, such as diamond, beryllium oxide, and or aluminum nitride to the coating prior to applying it to a wire bonded or flip chip die. The resulting coating (or paste) over the die may possess a very high thermal conductivity without creating an electrically conductive path. Thus, hot spots on the die could be easily spread over the entire die surface and conceivably to the boar to which the component is attached.

Figure 5:
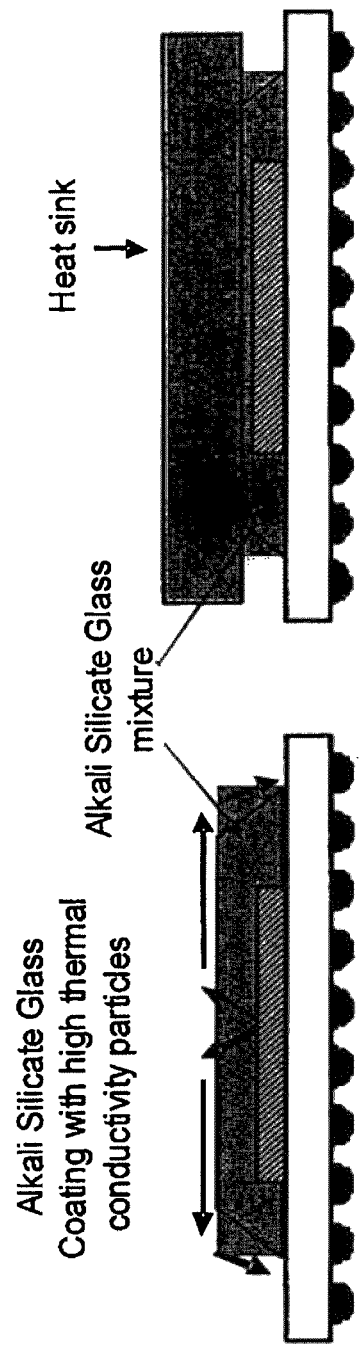

Using high thermal conductivity "filled" coating solution for creating low cost thermal bridges between high temperature components or power dissipating die and thermal sinks. The solution may be applied and cured at low temperature (≤100° C.). High thermal conductivity particles such as aluminum nitride, beryllium oxide, and or diamond (thermal conductivity near 2000 W/mK) can be used in this application to provide a highly thermally conducting path. See FIG. 5 or an exemplary illustration.

Figure 6:
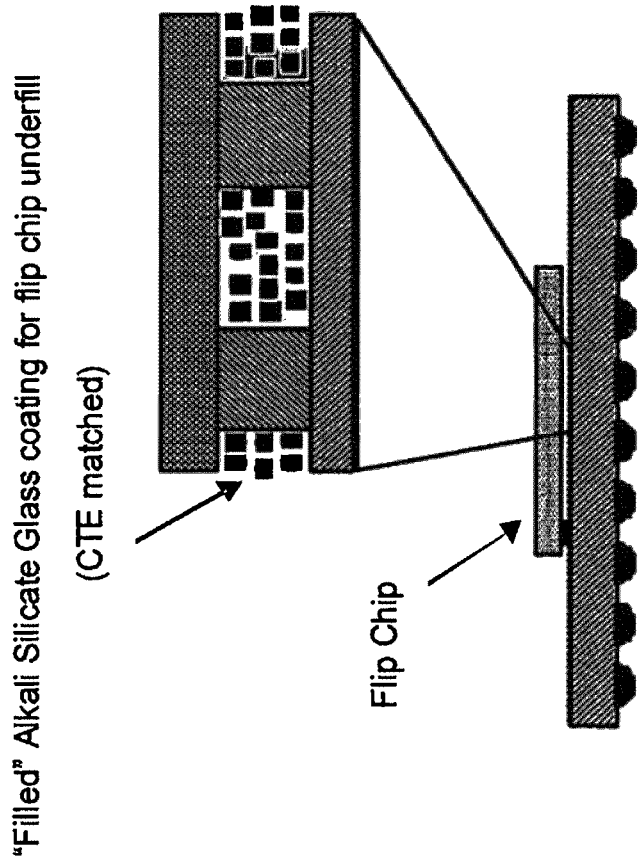

Adding a coefficient of thermal expansion (CTE) matching filler, such as glass or ceramics, to the coating liquid to increase the bond layer thickness so that the solution can be used as an underfill for flip chip devices. This may provide both tamper resistance protection to the die while improving its thermal cycle and shock loading reliability as do many other underfills. Another advantage to this configuration is that these coatings may provide a high-temperature underfill solution (>700° C.). Current underfills are limited to relatively low operating temperatures (≤200° C.). An illustration of this is shown in FIG. 6.

Figure 7:
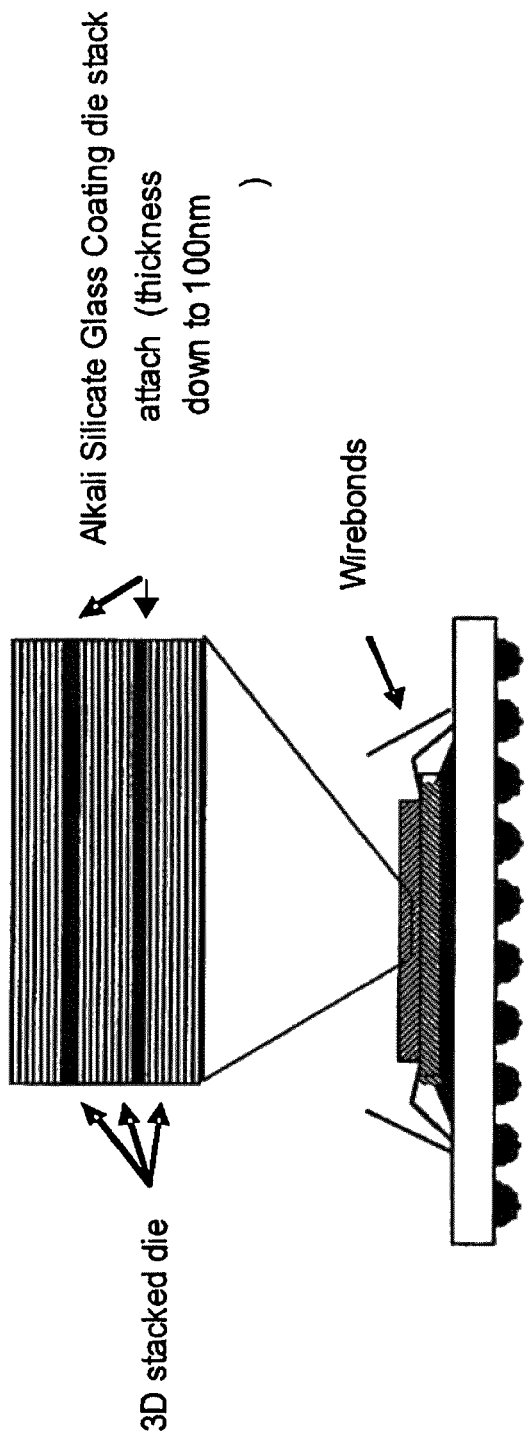

Use these coatings to create 3D wire bondable or flip chip stacked IC's. These coatings provide a unique high-temperature (>200° C.) solution for chip stacking. The coating bond layer thickness can be made as thin as 100 nm, allowing for the thinnest possible interface formed at low temperature. The coating bonds are very strong and rigid allowing the possibility of wire bonding at higher stack levels without stack compliance (smashing) causing problems. The thinner bonding layers would decrease thermal resistance, thus improving heat transfer. High thermal conductivity particles may also be added to improve heat transfer. The majority of chip or wafer stacking adhesives are not hermetic, which can lead to corrosion and degradation of the bonding interface over time. See FIG. 7, for example.

Figure 8:
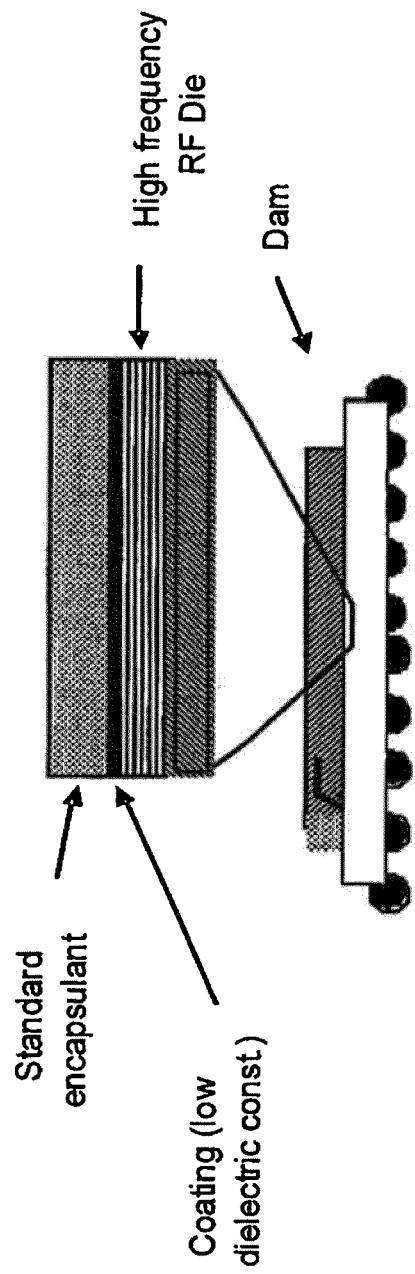

Applying coating over high frequency electronic components to create a low dielectric coating (Er=3 to 10) to improve RF performance. These devices may then be encapsulated using standard methods and encapsulants to improve their reliability and handling characteristics without degrading their electrical performance. See FIG. 8 for an example.

While the detailed drawings, specific examples, and particular formulations given described exemplary embodiments, they serve the purpose of illustration only. It should be understood that various alternatives to the embodiments of the invention described maybe employed in practicing the invention. It is intended that the following claims define the scope of the invention and that structures within the scope of these claims and their equivalents be covered thereby. The hardware and software configurations shown and described may differ depending on the chosen performance characteristics and physical characteristics of the computing and analysis devices. For example, the type of computing device, communications bus, or processor used may differ. The systems shown and described are not limited to the precise details and conditions disclosed. Method steps provided may not be limited to the order in which they are listed but may be ordered any way as to carry out the inventive process without departing from the scope of the invention. Furthermore, other substitutions, modifications, changes and omissions may be made in the design, operating conditions and arrangements of the exemplary embodiments without departing from the scope of the invention as expressed in the appended claims.

What is claimed is:

1. An electronics package, comprising: a substrate; at least one electronic component coupled to the substrate; and an alkali silicate glass coating forming a hermetic seal around at least a portion of the at least one electronic component, wherein the alkali silicate glass coating is silica rich, wherein the alkali silicate glass coating comprises a plurality of nanoparticles comprising calcium carbonate, zinc oxide, or combinations thereof, and the plurality of nanoparticles further comprise metal nanoparticles.

2. The electronics package of claim 1, wherein the alkali silicate glass coating is formed from a solution comprising $SiO_2$ and $M_2O$.

3. The electronic package of claim 1, wherein the alkali silicate glass coating is formed by mixing alkali silicate glass in a solvent.

4. The electronic package of claim 1, wherein the coating comprises thermally conductive particles.

5. The electronic package of claim 1, wherein the electronics package comprises a wire bond.

6. The electronics package of claim 1, wherein the coating comprises thermally conductive particles comprising diamond, aluminum nitride, beryllium oxide, a metal, or combinations thereof.

7. The electronics package of claim 1, wherein the alkali silicate glass coating has a silicate ratio of ≥3.25.

8. The electronic package of claim 3, wherein the solvent comprises water.

9. The electronic package of claim 8, wherein the ratio of water to the alkali silicate glass is at least 3 to 1.

10. The electronic package of claim 8, wherein the ratio of water to the alkali silicate glass is at least 5 to 1.

11. The electronic package of claim 8, wherein the water comprises deionized water.

12. An electronics package, comprising: a substrate; at least one electronic component coupled to the substrate; and a low curing temperature glass coating forming a hermetic seal around at least a portion of the at least one electronic component, wherein the low curing temperature glass is a silica rich alkali silicate glass coating, wherein the low curing temperature glass coating comprises a plurality of nanoparticles comprising calcium carbonate, zinc oxide, or combinations thereof, and the plurality of nanoparticles further comprise metal nanoparticles.

13. The electronics package of claim 12, wherein the glass coating is formed by diluting a low temperature bonding (LTB) solution comprising the low curing temperature glass in a solvent.

14. The electronic package of claim 12, wherein the coating comprises thermally conductive particles.

15. The electronics package of claim 13, wherein the solvent comprises water.

16. The electronics package of claim 13, wherein the ratio of the water to the LTB solution is at least 3 to 1.

17. The electronics package of claim 13, wherein the ratio of the water to the LTB solution is at least 5 to 1.

18. The electronics package of claim 13, further comprising an integrated circuit die on the substrate.

19. The electronics package of claim 13, further comprising an integrated circuit die on the substrate, the integrated die comprising at least one of a wire bonded die or a flip chip die.

20. The electronics package of claim 13, wherein the coating comprises microparticles and nanoparticles.

21. The electronics package of claim 17, wherein the water comprises deionized water.

* * * * *